United States Patent
Mochizuki

(10) Patent No.: US 7,418,036 B2
(45) Date of Patent: Aug. 26, 2008

(54) METHOD AND CIRCUIT FOR TIMING PULSE GENERATION

(75) Inventor: Hideaki Mochizuki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 1009 days.

(21) Appl. No.: 10/790,879

(22) Filed: Mar. 3, 2004

(65) Prior Publication Data

US 2005/0105607 A1 May 19, 2005

(30) Foreign Application Priority Data

Nov. 17, 2003 (JP) .............................. 2003-387116

(51) Int. Cl.
*H03K 7/04* (2006.01)
*H03K 7/06* (2006.01)
*H03K 9/04* (2006.01)
*H03K 9/06* (2006.01)

(52) U.S. Cl. ....................... 375/239; 375/357; 370/216; 370/506; 370/512; 340/512

(58) Field of Classification Search ................. 375/239, 375/357; 370/216, 506, 512; 340/512
See application file for complete search history.

(56) References Cited

U.S. PATENT DOCUMENTS

| | | | | |
|---|---|---|---|---|
| 5,668,531 A | * | 9/1997 | Sukegawa et al. ........... | 340/506 |
| 5,857,092 A | * | 1/1999 | Nakamura et al. ............. | 710/62 |
| 7,054,401 B2 | * | 5/2006 | Kada et al. ................... | 375/355 |

FOREIGN PATENT DOCUMENTS

| | | |
|---|---|---|
| JP | 7-303099 | 11/1995 |
| JP | 7-336338 | 12/1995 |
| JP | 2002-44062 | 2/2002 |

\* cited by examiner

*Primary Examiner*—Ted Wang
(74) *Attorney, Agent, or Firm*—Staas & Halsey LLP

(57) ABSTRACT

In a method and a circuit for timing pulse generation, a frame pulse of a corresponding system is masked when an alarm signal of either a working system or a protection system is received, a monitoring window which indicates an absorbable range of delay time difference between the frame pulses is generated upon an arrival of the frame pulse of the system selected by a switching signal, when the alarm signal of a system not selected is generated upon selection of the switching signal. Alternatively, a request signal for regenerating the monitoring window which indicates an absorbable range of delay time difference between the frame pulses is provided upon an arrival of the frame pulse of the system selected by the switching signal, when a slip signal is generated upon selection of the switching signal. The monitoring window is generated around the frame pulse selected by the switching signal when the monitoring window generation request signal is received, a read timing pulse common to memories of both systems is generated at a predetermined timing position, and the monitoring window is regenerated when the selected frame pulse deviates from the monitoring window. Alternatively, a correction signal including a number and a direction of bits when a reference timing pulse not selected deviates from the monitoring window is generated to be transmitted, the correction signal is extracted from a main signal received, and a position of the reference timing pulse of the protection system is corrected based on the correction signal, when the protection system is presently selected.

2 Claims, 11 Drawing Sheets

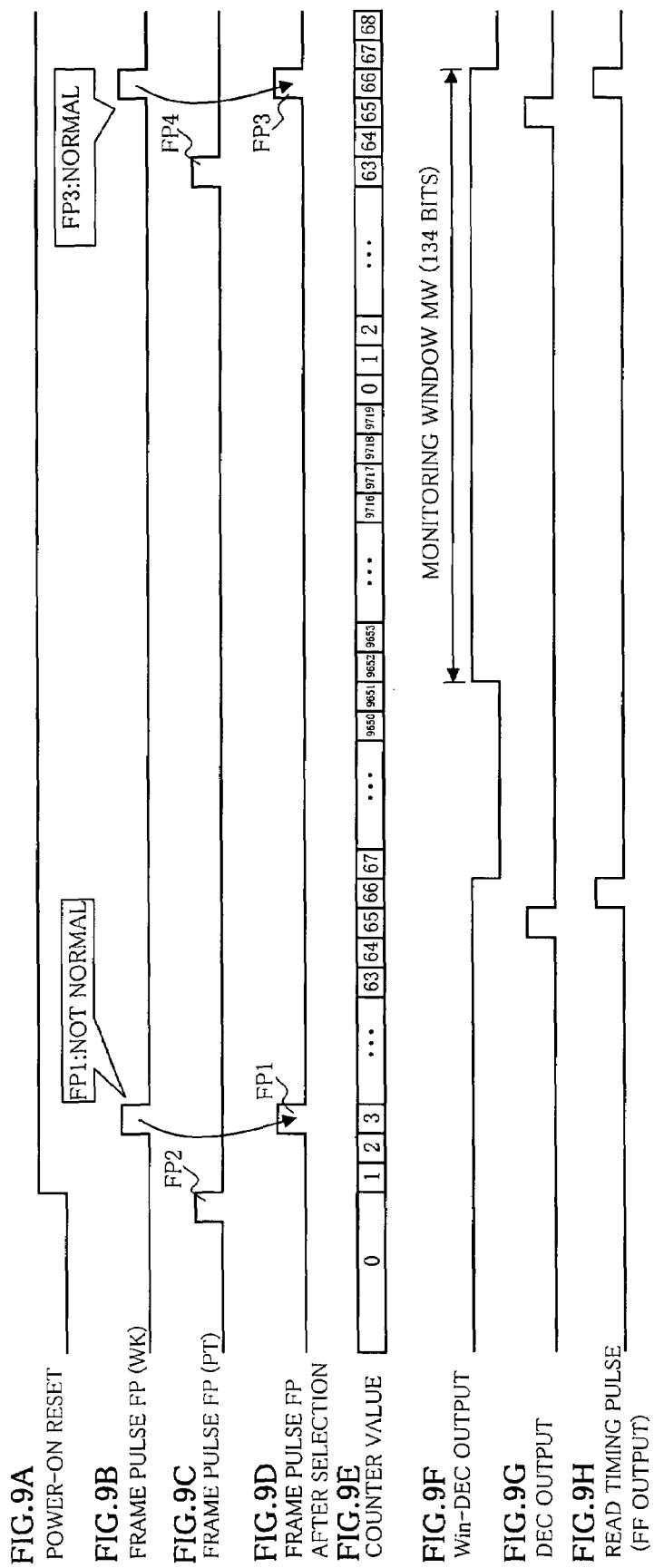

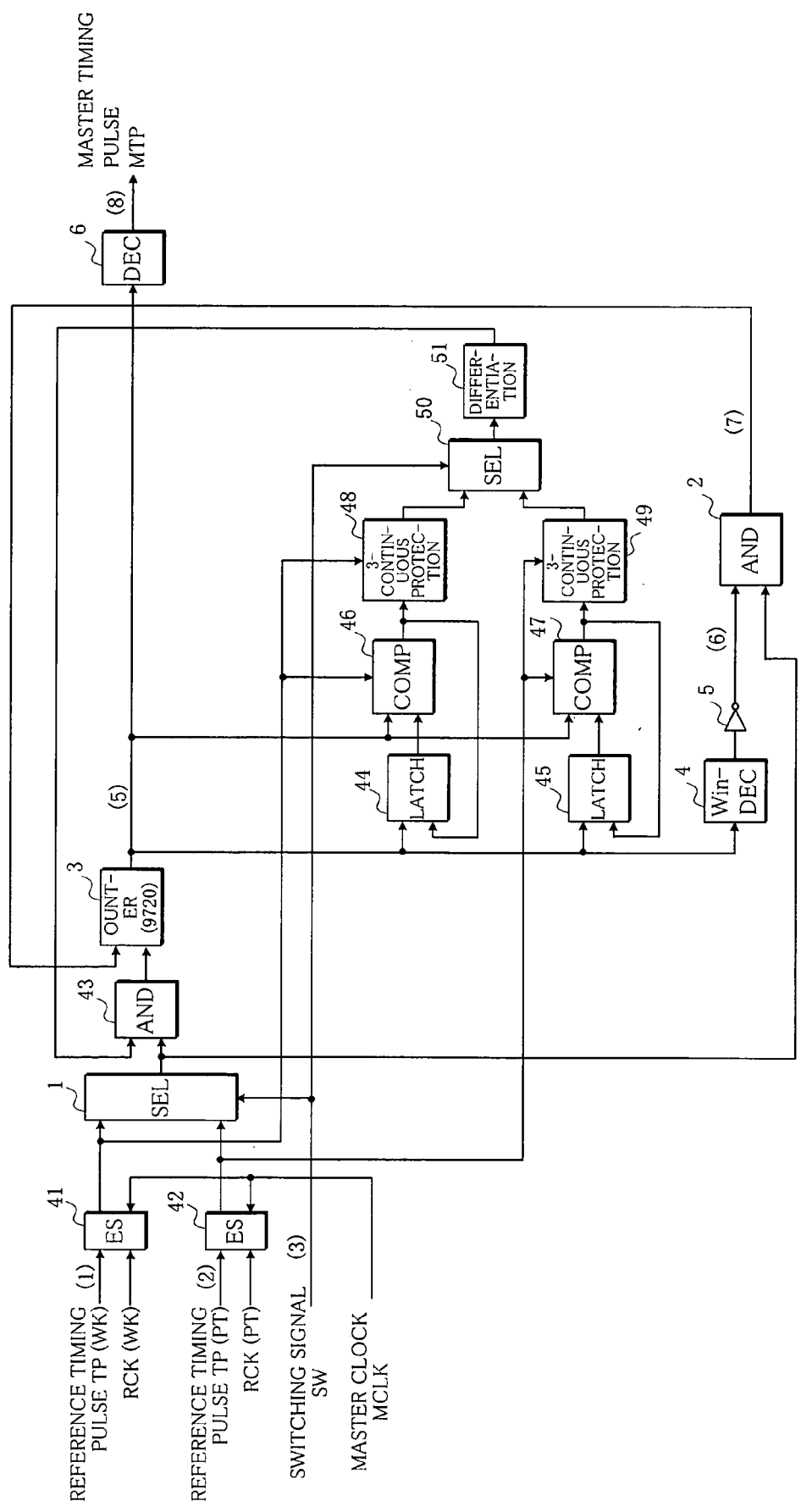

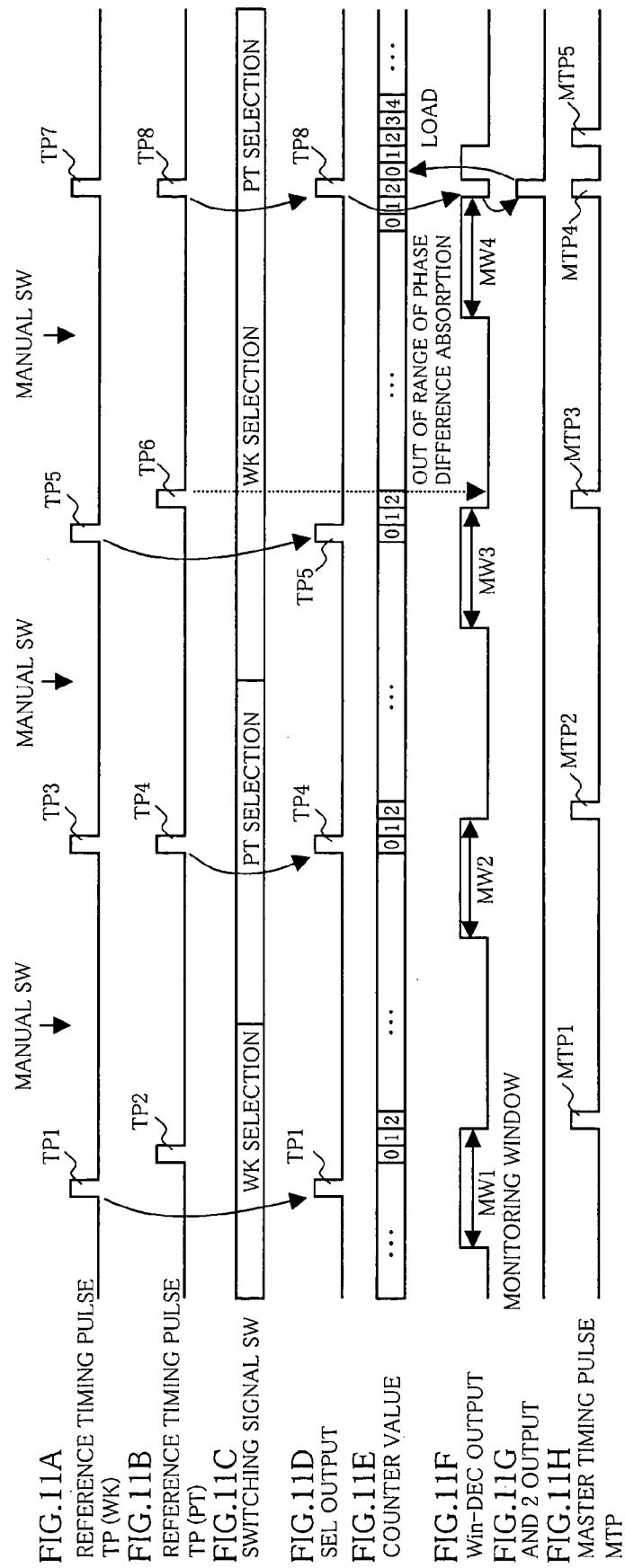

METHOD AND CIRCUIT FOR TIMING PULSE GENERATION

BACKGROUND OF THE INVENTION

1. Field of the Invention

The present invention relates to a method and a circuit for timing pulse generation, and in particular to a method and a circuit for hitless timing pulse generation which manually switch frame pulses or reference timing pulses of a working system and a protection system and to prevent errors from arising upon generation of read timing pulses or master timing pulses respectively.

2. Description of the Related Art

In recent communication devices, a high quality of transmitting signals is required, and signals with large capacity have been processed, together with a high integration of the communication devices, whereby generated timing pulses are extremely influenced by a signal switchover operation between a working system and a protection system. Therefore, a demand for generation of error-free timing pulses without any instantaneous interruption has been growing when the switchover is manually executed for maintenance or the like.

When an arrangement of operating the communication devices according to a frame pulse or a reference timing pulse that is a base of the frame pulse is adopted, and when a unit is switched over between the working system and the protection system by a manual switchover within the communication devices, a switchover between main signal data or the reference timing pulses has been required so far.

FIG. 7 shows an arrangement of a general main signal data switching circuit, in which a frame pulse FP (WK) indicating a head position of a signal and main signal data (WK) of a working system are provided to an ES (elastic store) memory 100, and a frame pulse FP (PT) and main signal data (PT) of a protection system are provided to an ES memory 200. At the ES memory 100, clock change from a received clock (WK) to a master clock MCLK is performed to the frame pulse FP (WK) and the main signal data (WK) of the working system to be transmitted to a memory RAM (WK) 500 of the working system. Similarly, at the ES memory 200, clock change from a received clock (PT) to the master clock MCLK is performed to the frame pulse FP (PT) and the main signal data (PT) of the protection system to be transmitted to a memory RAM (PT) 700 of the protection system.

A write address generator 300 of the working system generates a write address based on the frame pulse FP (WK) and the master clock MCLK. By providing this write address to the memory RAM (WK) 500, the frame pulse FP (WK) and the main signal data (WK) are written. Also, a write address generator 400 of the protection system generates the write address based on the frame pulse FP (PT) and the master clock MCLK. By providing this address to the memory RAM (PT) 700, the frame pulse FP (PT) and the main signal data (PT) are written.

A read timing pulse generation circuit 600 common to the working system and the protection system inputs the frame pulse FP (WK) of the working system and the frame pulse FP (PT) of the protection system. These frame pulses are switched by a manual switching signal SW, and a read timing pulse RTP is generated based on the master clock MCLK to be transmitted to a read address generator 800 common to the working system and the protection system.

The read address generator 800 generates a read address common to the memories RAM (WK) 500 and RAM (PT) 700 based on the read timing pulse RTP and the master clock MCLK to be provided to the memories. Then, the frame pulse FP (WK), the main signal data (WK), the frame pulse FP (PT), and the main signal data (PT) in the read address are simultaneously read out of the memories RAM (WK) 500 and RAM (PT) 700 to be respectively provided to a switch 900 simultaneously. The manual switching signal SW is provided to the switch 900, whereby the frame pulse and the main signal data according to the manual switching signal SW are selected and outputted.

FIG. 8 shows an arrangement of the read timing pulse generation circuit 600 in the above-noted main signal data switching circuit. In this arrangement, the frame pulse FP (WK) of the working system and the frame pulse FP (PT) of the protection system are provided to a selector (SEL) 1, which is switched for the selection by the manual switching signal SW. The frame pulse selected by the selector 1 is provided to one input terminal of an AND gate 2 as a window monitoring portion. When an output signal of the AND gate 2 is "H" level, the output signal is provided to an L terminal of a counter 3 as a load signal, and "0" preset to a D terminal is loaded, so that the counter 3 starts a count operation according to the master clock MCLK.

The output signal of the counter 3 is provided to a monitoring window generator (Win-DEC) 4 for generating a monitoring window, and the output signal of the monitoring window generator 4 is provided to the other input terminal of the AND gate 2 through an inverter 5. Also, the output signal of the counter 3 is decoded at a predetermined timing (frame) position by a decoder 6 and provided to a flip-flop 7. Then, the output signal is outputted as the read timing pulse RTP by the master clock MCLK.

FIGS. 9A-9H show operation time charts of the read timing pulse generation circuit shown in FIG. 8. Hereinafter, a circuit operation of FIG. 8 will now be specifically described referring to the time charts.

Firstly, supposing a frame pulse FP1 of the working system shown in FIG. 9B and a frame pulse FP2 shown in FIG. 9C are provided to the selector 1 after a power-on reset operation as shown in FIG. 9A, the selector 1 selects e.g. the frame pulse FP1 as shown in FIG. 9D with the manual switching signal SW. The selected frame pulse FP1 is transmitted to the AND gate 2. However, after the power-on reset shown in FIG. 9A, the counter 3 starts the count operation, and outputs a counter value as shown in FIG. 9E to be provided to the monitoring window generator 4 and the decoder 6 (DEC).

Supposing the monitoring window generator 4 is set to generate the monitoring window (an absorbable range of delay time difference between the frame pulses, which are fluctuations of frame pulses of both systems) which becomes "H" level in 134 bit-interval from the counter value "9652" to "66" as shown in FIG. 9F, a signal of an "L" level (corresponds to a monitoring window based on a decoded value) is provided to the AND gate 2 as a result of an inversion of a Win-DEC output at the inverter 5. Therefore, the AND gate 2 assumes a disable state, and the frame pulse FP1 after the selection is blocked by the AND gate 2, whereby no load signal is provided to the counter 3, so that the count operation is continued.

Thus, as shown in FIG. 9F, the Win-DEC output changes to the "L" level at the counter value "66".

Supposing a fixed value "65" is set in the decoder 6 during that time, a pulse is outputted at the counter value, "65" as shown in FIG. 9G to be transmitted to the flip-flop 7, which is tapped or driven by the master clock MCLK, so that the read timing pulse RTP shifted by a single clock is generated.

The Win-DEC output from the counter value "67" to "9651" assumes "L", and the monitoring window MW is formed from the counter value "9652" to "66".

However, when the flame pulse after the selection shown in FIG. 9D deviates from the monitoring window MW, the AND gate 2 becomes the enable state and the load signal is provided to the counter 3. Therefore, the counter 3 loads "0" already connected to the D terminal, and the counter value returns to "0", thereby restarting the count operation.

The same applies to frame pulses FP3 and FP4 shown in the right side of FIGS. 9C and 9D.

On the other hand, FIG. 10 shows a prior art arrangement of a master timing pulse generation circuit which is a base of the above-mentioned frame pulse. This master timing pulse generation circuit is provided in an interface card 23 (described later) as shown in FIG. 5. A reference time pulse which is a base of the generated master time pulse MTP is provided from a common portion 22 (working system or protection system) similarly shown in FIG. 5. For an arrangement of generating the master timing pulse MTP from the reference timing pulse of the working system or the protection system, the monitoring window is used in the same way as the read timing pulse generation circuit as shown in FIG. 8.

The operation of the master timing pulse generation circuit shown in FIG. 10 will now be described referring to time charts shown in FIGS. 11A-11H.

Firstly, a reference timing pulse TP (WK) of the working system and a reference timing pulse TP (PT) of the protection system respectively shown in FIGS. 11A and 11B are respectively provided to ES memories 41 and 42. At the ES memories 41 and 42, in the same way as FIG. 7, the clock change is performed from the received clocks RCK (WK) and RCK (PT) to the master clock MCLK common to the systems and outputted to the selector 1 respectively.

The manual switching signal SW shown in FIG. 11C is provided to the selector 1, which firstly selects a reference timing pulse TP1 of the working system as shown in FIG. 11D, according to the switching signal SW, to be transmitted to an AND gate 43. At this time, an input signal of the other end of the AND gate 43 is connected to a differentiation circuit 51. Since the counter value is normally "0", no load signal is provided from the AND gate 43 to the counter 3.

Accordingly, the counter 3 starts a count from the power-on reset state, and outputs the counter value as shown in FIG. 11E in the same way as the counter value shown in FIG. 9E. The output signal of the counter 3 is decoded at the decoder 6 and a master timing pulse MTP1 as shown in FIG. 11H is outputted when the counter value is "2" in this example in the same way as the above example.

On the other hand, the output signal of the selector 1 is also provided to the AND gate 2. This AND gate 2 composes a window monitoring portion, and the counter value of the counter 3 is inputted to the other input terminal of the AND gate 2 through the monitoring window generator 4 and the inverter 5. The output signal of the AND gate 2 serves as the load signal of the counter 3 in the same way as the case of FIG. 8. It is to be noted that output signals of the AND gates 2 and 43 are provided to the counter 3 as the load signals by a logical OR circuit.

Also, an arrangement for monitoring the reception of the reference timing pulse after the clock change through the ES memories 41 and 42 at the same timing positions a predetermined times continuously is added to FIG. 10.

Namely, in the working system, the counter value of the counter 3 held by a latch circuit 44 is compared with the reference timing pulse TP (WK) outputted from the ES memory 41 at a comparison circuit 46. When both are coincident with each other, and when the coincidence is detected three times continuously at a 3-continuous protection circuit 48, the result is outputted to a selector 50. Similarly in the protection system, a latch circuit 45, a comparison circuit 47, and a 3-protection circuit 49 perform 3-continuous protection for the timing pulse TP (PT) of the protection system and the counter value of the counter 3 to be provided to the selector 50. The selector 50 selects the output signals of the 3-protection circuits 48 and 49 according to the switching signal SW. In case the pulse is received at the same timing position three times continuously at this time, the differentiation circuit 51 provides the load signal to the counter 3, so that and the counter 3 restarts counting from "0".

On the other hand, there is a clock change circuit in which reception data are received by a received clock, at least three pieces of data with different phases are prepared from the received data by a transmission clock, one of the three pieces of the data with different phases are selected by the first and the second switchover control signals, the phases of the reception and the transmission clocks are compared with each other, the coincidence of both phases is detected, a phase fluctuation direction of the reception and the transmission clocks is monitored, and the first and the second switchover control signals for clock change are prepared based on the coincidence result of the phase comparison and the monitoring result of the phase fluctuation direction (see e.g. patent document 1).

Furthermore, there is a transmission frame method at the time of clock redundant system switchover comprising a frame synchronizing circuit for inputting a reception signal and outputting a reception frame pulse, a clock switchover circuit for receiving clocks and a clock switching signal and transmitting a selection clock, a frame phase comparison circuit for receiving the clock switching signal, the reception frame pulse, a transmission frame pulse, and the selection clock, and transmitting a frame correction control signal, and a frame generation circuit for receiving the selection clock and the frame correction control signal, and transmitting a transmission signal, and the transmission frame pulse (see e.g. patent document 2).

Furthermore, there are a device and a method for clock supply having a hold-over function for holding an output clock in a state before switching upon a clock switchover and for synchronizing the output clock to a newly selected clock after matching the phase of the selection clock with the phase of the output clock, means for comparing the phase of the newly selected clock with the phase of the held output clock at predetermined intervals, and outputting the comparison result by a digital value, and means for controlling the output clock based on the increase/decrease of the comparison result or a fixed result (see e.g. patent document 3).

[Patent Document 1]
Japanese Patent Application Laid-open No.7-336338 (FIG. 1, abstract).

[Patent Document 2]
Japanese Patent Application Laid-open No.7-303099 (FIG. 1, abstract).

[Patent Document 3]
Japanese Patent Application Laid-open No.2002-44062 (FIG. 1, abstract).

As described above, there have been disadvantageous in the read timing pulse generation circuit used for the main signal data switching circuit and the master timing pulse generation circuit for generating the master timing pulse which forms a base of the frame pulse used for the main signal data switching circuit, as follows:

(1) Problem of Read Timing Pulse Generation Circuit

As shown in the time charts shown in FIGS. 9A-9H, supposing the frame pulse FP1 shown in FIG. 9B is not normal, the monitoring window MW by the monitoring window generator 4 has the selected frame pulse FP1 around the center as a result of the selection of the frame pulse FP1 at the selector 1. Namely, as long as the frame pulse (e.g. FP1) outputted at an error position in an unstable state such as a recovery time from a fault state does not deviate from the monitoring window MW, and even though the frame pulse FP3 which then coincidentally becomes normal as shown in FIG. 9B is provided to the AND gate 2 as the frame pulse FP3 after selection as shown in FIG. 9D, the monitoring window is not regenerated, and the monitoring window continues at a position deviating from the normal position since the frame pulse FP3 exists at the margin of the monitoring window NW. As a result, a read timing pulse which is not normal is generated when the switching operation by the manual switching signal SW is performed.

(2) Problem of Master Timing Pulse Generation Circuit

In the time charts of the master timing pulse generation circuit shown in FIGS. 11A-11H, every time the working system-protection system switchover of the reference timing pulse is executed as shown in FIG. 11C, the reference timing pulses TP1, TP4, TP5, and TP6 outputted from the selector 1 as shown in FIG. 11D respectively deviate from the monitoring windows MW1-MW4. When the monitoring window MW4 falls (when the inverter output rises), the output of the selector 1 selects the reference timing pulse TP8, whereby the input of the AND gate 2 assumes "2", and the output of the AND gate 2 assumes "H" level as shown in FIG. 11G. By this signal, as shown in FIG. 11E, the counter 3 is loaded or reset to "0", an irregular master timing pulse MTP5 is generated at the set value ("2" in this example) of the decoder 6 after the master timing pulse MTP4 as shown in FIG. 11H, resulting in an error occurrence.

SUMMARY OF THE INVENTION

It is accordingly an object of the present invention to provide a method and a circuit for timing pulse generation which can provide a switchover without instantaneous interruption upon a stable and manual switchover, without an occurrence of errors even when a monitoring window is erroneously prepared or generated by a frame pulse generated in an unstable state, and a reference timing pulse position changes every switchover.

In order to achieve the above-mentioned object, a timing pulse generation method comprises: a mask step of masking a frame pulse of a corresponding system when an alarm signal of either a working system or a protection system is received; a selection step of selecting the frame pulse after the mask step by a switching signal; and a monitoring window generation step of generating a monitoring window which indicates an absorbable range of delay time difference between the frame pulses around the frame pulse selected by the switching signal, of generating a read timing pulse common to memories of both systems at a predetermined timing position, and of regenerating the monitoring window when the selected frame pulse deviates from the monitoring window.

Namely, in an unstable state such as a system startup and a recovery from a fault state as mentioned above, an alarm signal is usually generated. When such an alarm signal is received in a working system or a protection system, a frame pulse of the corresponding system is masked whereby only a frame pulse not masked is selected by a switching signal. When both frame pulses are masked, no frame pulse is selected by the switching signal. In case where only one of them is masked and the selection is not made by the switching signal, no frame pulse is provided.

Accordingly, in the presence of a selected frame pulse, in the same way as the prior art, a monitoring window is generated which indicates an absorbable range of delay time difference between the frame pulses, that is a fluctuation of the frame pulses, around the selected frame pulse, and a read timing pulse common to memories of both systems is generated at a predetermined timing position. Also, when the selected frame pulse deviates from the monitoring window, the monitoring window is regenerated.

Thus, in an alarm state such as a power startup time in which the head position of the data is not stable, there is a possibility in the prior art that the monitoring window is generated at an error position, whereas the present invention generates no error monitoring window, thereby enabling only a normal monitoring window to be generated.

Also, a timing pulse generation method according to the present invention comprises: a selection step of selecting a frame pulse of either a working system or a protection system by a switching signal; a monitoring window request step of selecting an alarm signal of a system not selected by the switching signal when an alarm signal of either the working system or the protection system is received, and of outputting a request signal for generating a monitoring window which indicates an absorbable range of delay time difference between the frame pulses upon an arrival of the frame pulse of the system selected by the switching signal, when the alarm signal of a system not selected is generated after a maximum delay time from selecting the switching signal to transferring the frame pulse; and a monitoring window generation step of generating the monitoring window around the selected frame pulse when the monitoring window generation request signal is received, of generating a read timing pulse common to memories of both systems at a predetermined timing position, and of regenerating the monitoring window when the selected frame pulse deviates from the monitoring window.

Namely, when either of frame pulses of a working system and a protection system is selected by a switching signal, and when an alarm signal of the working system or the protection system is received, a signal (alarm signal) of a system not selected by the switching signal is selected, and a change in the switching signal is detected. When the alarm signal still continues the alarm state after delaying this change information by a maximum delay time for transferring the frame pulse, a request signal for generating the monitoring window of the frame pulse is outputted preferably only once when the frame pulse of the selected system arrives.

When the monitoring window generation request signal is received, in the same way as the above, the monitoring window around the selected frame pulse is generated, a read timing pulse common to memories of both systems is generated at a predetermined timing position. When the selected frame pulse deviates from the monitoring window, the monitoring window is regenerated.

Thus, the position of the frame pulse indicating the head of the data may change when the switchover operation is performed by the generation of the alarm signal. Therefore, the monitoring window is regenerated at a normal position after the switchover by the alarm generation, thereby enabling a stable switchover without instantaneous interruption to be realized.

When a slip operation occurs at an ES memory because of clock changes, in addition to the alarm signal of the working system or the protection system mentioned above, a load to a counter with an error frame pulse becomes required to be prevented.

For this purpose, the present invention can provide a timing pulse generation method comprising: a selection step of selecting a frame pulse of either a working system or a protection system by a switching signal; a monitoring window request step of selecting each slip signal from an ES memory for clock change of either the working system or the protection system by the switching signal, and of providing a request signal for generating a monitoring window which indicates an absorbable range of delay time difference between the frame pulses upon an arrival of the frame pulse of the system selected by the switching signal, when the slip signal is generated after a maximum delay time from selecting the switching signal to transferring the frame pulse; and a monitoring window generation step of generating the monitoring window around the frame pulse selected by the switching signal when the monitoring window generation request signal is received, of generating a read timing pulse common to memories of both systems at a predetermined timing position, and of regenerating the monitoring window when the selected frame pulse deviates from the monitoring window.

Namely, when an ES slip signal continues even after delaying the ES slip signal of a system at the time when the ES slip signal detected by an ES memory is selected by the switching signal, by the maximum delay time of a frame pulse to be transferred, a request signal for generating (regenerating) the monitoring window upon an arrival of the frame pulse after the selection by the switching signal is generated, whereby the monitoring window is regenerated by a normal timing pulse after an ES slip occurrence.

Thus, when the ES memory is used for changing to a system clock from the frame pulse indicating the head position of the inputted data, an ES memory slip occurs for some reason, and the frame pulse is coincidentally stored in the memory, the stored frame pulse is read after a recovery from the ES memory slip. However, the pulse may have error timing by the ES memory slip. If the monitoring window is regenerated by the frame pulse, the position of the monitoring window becomes erroneous. Therefore, by using the frame pulse read from the ES memory after a fixed time elapses from the occurrence of the ES memory slip, the monitoring window is generated at a stable position, thereby enabling a stable operation.

On the other hand, the present invention may provide a timing pulse generation method comprising: a selection step of selecting a reference timing pulse of either a working system or a protection system by a switching signal, a monitoring window generation step of generating a monitoring window which indicates an absorbable range of delay time difference between the reference timing pulses around the reference timing pulse selected by the switching signal, of generating a master timing pulse at a predetermined timing position, and of regenerating the monitoring window when the selected reference timing pulse deviates from the monitoring window, a correction signal generation step of generating a correction signal including a number and a direction of bits when a reference timing pulse not selected deviates from the monitoring window, and a frame generation step of inserting the correction signal into an overhead of a main signal to be outputted; and an extraction step of extracting the correction signal from the main signal received, and a reference timing pulse generation step of correcting a position of the reference timing pulse of the protection system based on the correction signal, when the protection system is presently selected.

Namely, when a master timing pulse which forms a base of the above-mentioned frame pulse is generated, the position of a reference timing pulse which forms a base of the master timing pulse changes, and a change absorbable range (delay time difference range) in the above-mentioned monitoring window is exceeded, error occurs upon switchover execution. In order to exclude this error, the number and the direction of bits when a reference timing pulse not selected deviates from the monitoring window are obtained as a correction signal, the correction signal is inserted into an overhead of a main signal and outputted, the correction signal is extracted from the main signal received, and the position of the reference timing pulse of the protection system is corrected based on the correction signal, when the protection system is presently selected.

Accordingly, by keeping the reference timing pulse within the monitoring window which monitors the change absorbable range, it becomes possible to prevent errors from occurring upon switchover between the working system and the protection system.

Also, the above-mentioned invention can be realized by transferring the correction signal for generating the reference timing pulse as it is, and by correcting a position of the reference timing pulse of the protection system based on the correction signal on the receiving side, when the protection system is presently selected.

A timing pulse generation circuit for realizing the above-mentioned method comprises: a mask portion masking a frame pulse of a corresponding system when an alarm signal of either a working system or a protection system is received; a selector selecting the frame pulse outputted from the mask portion by a switching signal; and a monitoring window generator generating a monitoring window which indicates an absorbable range of delay time difference between the frame pulses around the frame pulse selected by the switching signal, generating a read timing pulse common to memories of both systems at a predetermined timing position, and regenerating the monitoring window when the selected frame pulse deviates from the monitoring window.

Furthermore, a timing pulse generation circuit according to the present invention comprises: a selector selecting a frame pulse of either a working system or a protection system by a switching signal;

a monitoring window request portion selecting an alarm signal of a system not selected by the switching signal when an alarm signal of either the working system or the protection system is received, and outputting a request signal for generating a monitoring window which indicates an absorbable range of delay time difference between the frame pulses upon an arrival of the frame pulse of the system selected by the switching signal, when the alarm signal of a system not selected is generated after a maximum delay time from selecting the switching signal to transferring the frame pulse; and a monitoring window generator generating the monitoring window around the frame pulse selected by the selector when the monitoring window generation request signal from the monitoring window request portion is received, generating a read timing pulse common to memories of both systems at a predetermined timing position, and regenerating the monitoring window when the selected frame pulse deviates from the monitoring window.

Furthermore, a timing pulse generation circuit according to the present invention comprises: a selector selecting a frame pulse of either a working system or a protection system by a switching signal; a monitoring window request portion selecting each slip signal from an ES memory for clock change of either the working system or the protection system by the switching signal, and providing a request signal for regenerating a monitoring window which indicates an absorbable range of delay time difference between the frame pulses upon an arrival of the frame pulse of the system selected by the switching signal, when the slip signal is generated after a maximum delay time from selecting the switching signal to transferring the frame pulse; and a monitoring window generator generating the monitoring window around the frame pulse selected by the switching signal when the monitoring window generation request signal from the monitoring window request portion is received, generating a read timing pulse common to memories of both systems at a predetermined timing position, and regenerating the monitoring window when the selected frame pulse deviates from the monitoring window.

Furthermore, a timing pulse generation circuit according to the present invention comprises: an interface card having a selector selecting a reference timing pulse of either a working system or a protection system by a switching signal, a monitoring window generator generating a monitoring window which indicates an absorbable range of delay time difference between the reference timing pulses around the reference timing pulse selected by the switching signal, generating a master timing pulse at a predetermined timing position, and regenerating the monitoring window when the selected reference timing pulse deviates from the monitoring window, a correction signal generator generating a correction signal including a number and a direction of bits when a reference timing pulse not selected deviates from the monitoring window, and a frame generator inserting the correction signal into an overhead of a main signal to be outputted; and a common portion having an extractor extracting the correction signal from the main signal received, and a reference timing pulse generator correcting a position of the reference timing pulse of the protection system based on the correction signal to be provided to the interface card, when the protection system is presently selected.

Furthermore, a timing pulse generation circuit according to the present invention comprises: an interface card having a selector selecting a reference timing pulse of either a working system or a protection system by a switching signal, a monitoring window generator generating a monitoring window which indicates an absorbable range of delay time difference between the reference timing pulses around the reference timing pulse selected by the switching signal, generating a master timing pulse at a predetermined timing position, and regenerating the monitoring window when the selected reference timing pulse deviates from the monitoring window, and a correction signal generator generating a correction signal including a number and a direction of bits when a reference timing pulse not selected deviates from the monitoring window; a controller transferring the correction signal from the interface card; and a common portion having a reference timing pulse generator correcting a position of the reference timing pulse of the protection system based on the correction signal transferred through the controller to be provided to the interface card, when the protection system is presently selected.

As described above, according to the present invention, it becomes possible to generate a monitoring window at a normal position when an alarm time such as a startup time and a fault occurrence time when signals are in an unstable state, or when an ES memory slips, whereby a data switchover can be stably executed in a main signal data switchover circuit or the like upon switchover between a working system and the protection system.

Also, even if a position of a reference timing pulse generated in a common portion or the like of the working system or the protection system changes, it becomes possible to generate a reference timing pulse of a non-operational (alarm) system within the monitoring window, with reference to a reference timing pulse of an operation system. Therefore, switchover without errors can be performed upon manual switchover execution, and a system can be realized with high transmission quality.

BRIEF DESCRIPTION OF THE DRAWINGS

The above and other objects and advantages of the invention will be apparent upon consideration of the following detailed description, taken in conjunction with the accompanying drawings, in which the reference numerals refer to like parts throughout and in which:

FIGS. 9A-9H are operation time charts of the prior art read timing pulse generation circuit shown in FIG. 8;

FIG. 10 is a block diagram showing a prior art arrangement of the master timing pulse generation circuit shown in FIG. 5; and FIGS. 11A-11H are operation time charts of the master timing pulse generation circuit shown in FIG. 10.

DESCRIPTION OF THE EMBODIMENTS

[1] Embodiment of Read Timing Pulse Generation Circuit

Figure 1:
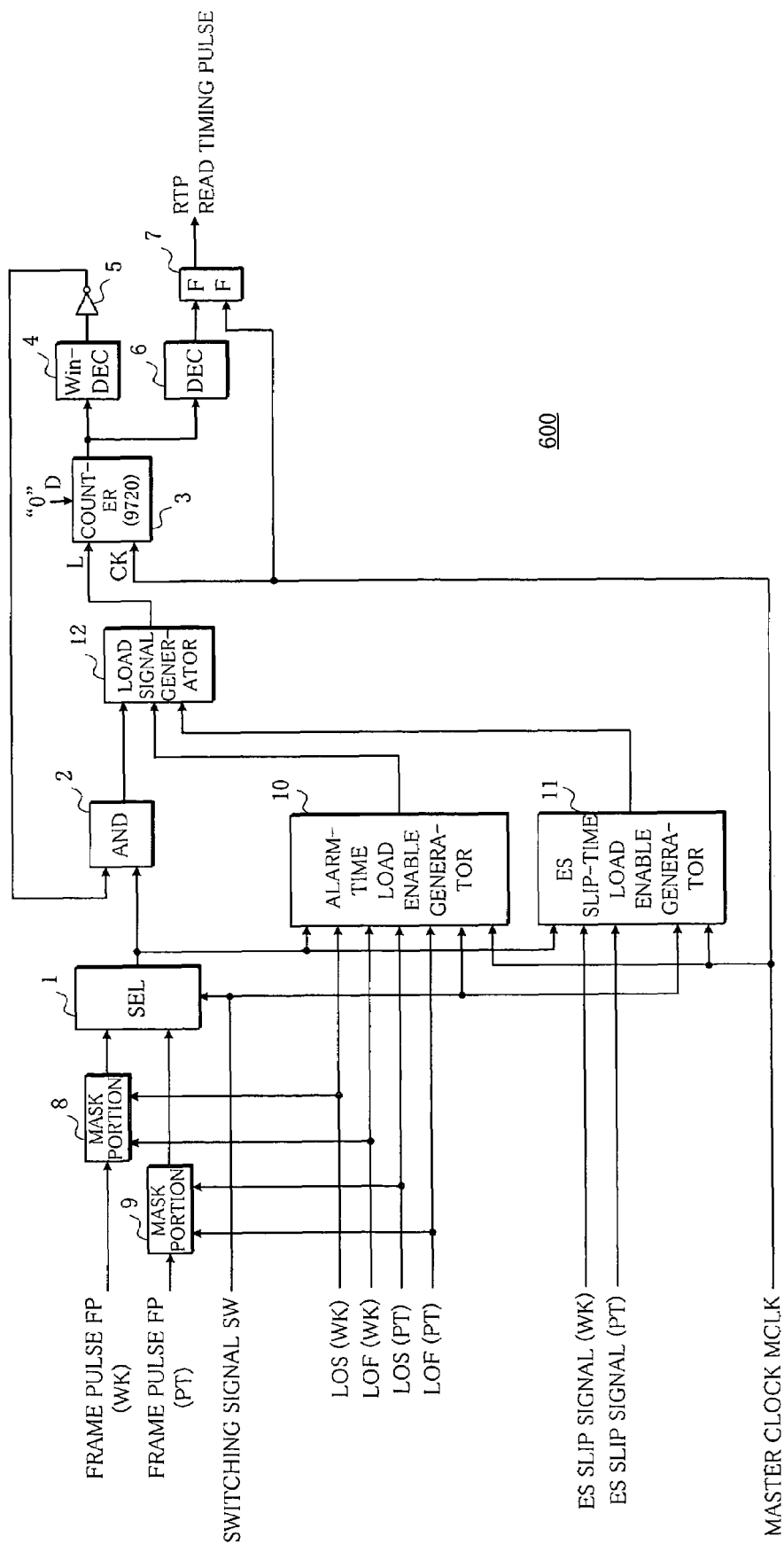
FIG. 1 is a block diagram showing an embodiment of a read timing pulse generation circuit as a timing pulse generation circuit realizing a timing pulse generation method according to the present invention.
Figure 8:
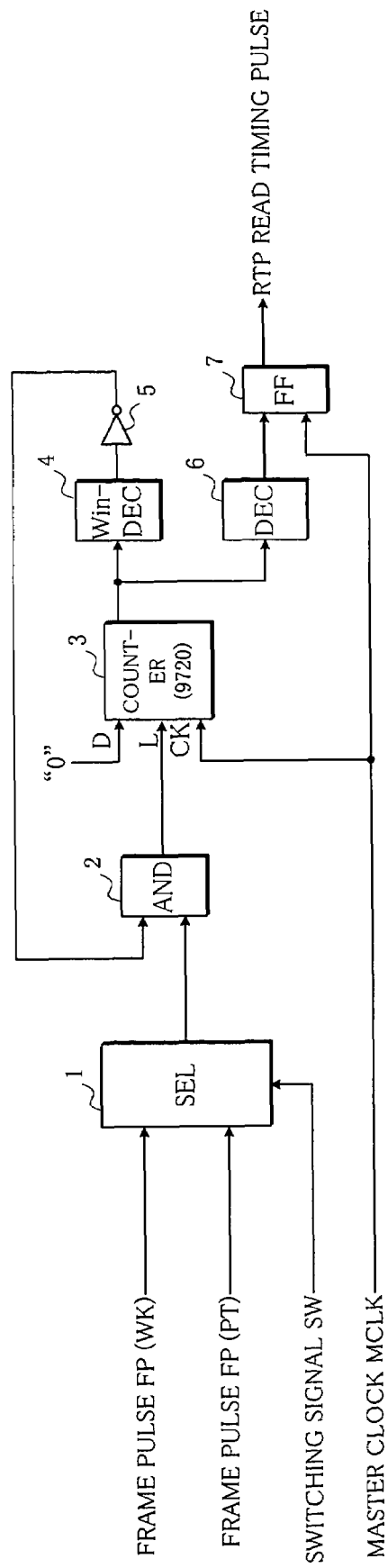
FIG. 8 is a block diagram showing an arrangement of the prior art read timing pulse generation circuit shown in FIG. 7.

FIG. 1 shows an embodiment of a read timing pulse generation circuit as a timing pulse generation circuit realizing a timing pulse generation method according to the present invention. This embodiment is different from the prior art example shown in FIG. 8 in that mask portions 8 and 9 of a working system and a protection system are respectively provided in front of the selector 1, and an alarm-time load enable generator 10 for generating a monitoring window at an optimum time, an ES slip-time load enable generator 11, and a load signal generator 12 for receiving output signals of the generators 10 and 11 and for providing a monitoring window generation request signal, i.e. a load request signal to a counter 3 are provided for the monitoring window generation circuit composed of the AND gate 2, the counter 3, the monitoring window generator 4, and the inverter 5.

Hereinafter, each portion of the embodiment will now be described.

(1) Embodiment of Mask Portion

A frame pulse FP (WK) of the working system and an LOS (Loss Of Signal) (WK) and an LOF (Loss Of Frame) (WK) as an alarm signal are provided to the mask portion 8. Similarly, a frame pulse FP (PT) of the protection system, an LOS (PT) signal, and an LOF (PT) signal as an alarm signal are provided to the mask portion 9. When receiving the LOS signal or the LOF signal, the mask portions 8 and 9 mask the frame pulses FP (WK) and FP (PT) respectively and prevent the frame pulses from being provided to the selector 1.

Thus, although the head position of the data is not stable when the alarm signal is generated, the generation of the monitoring window in an error position is prevented.

This alarm signal is also generated at an unstable state such as a startup time of a system and a recovery time from a fault state. Therefore, the generation of the monitoring window in error positions at a power startup time is prevented, thereby enabling a normal monitoring window to be generated.

(2) Embodiment of Alarm-Time Load Enable Generator

Figure 2:
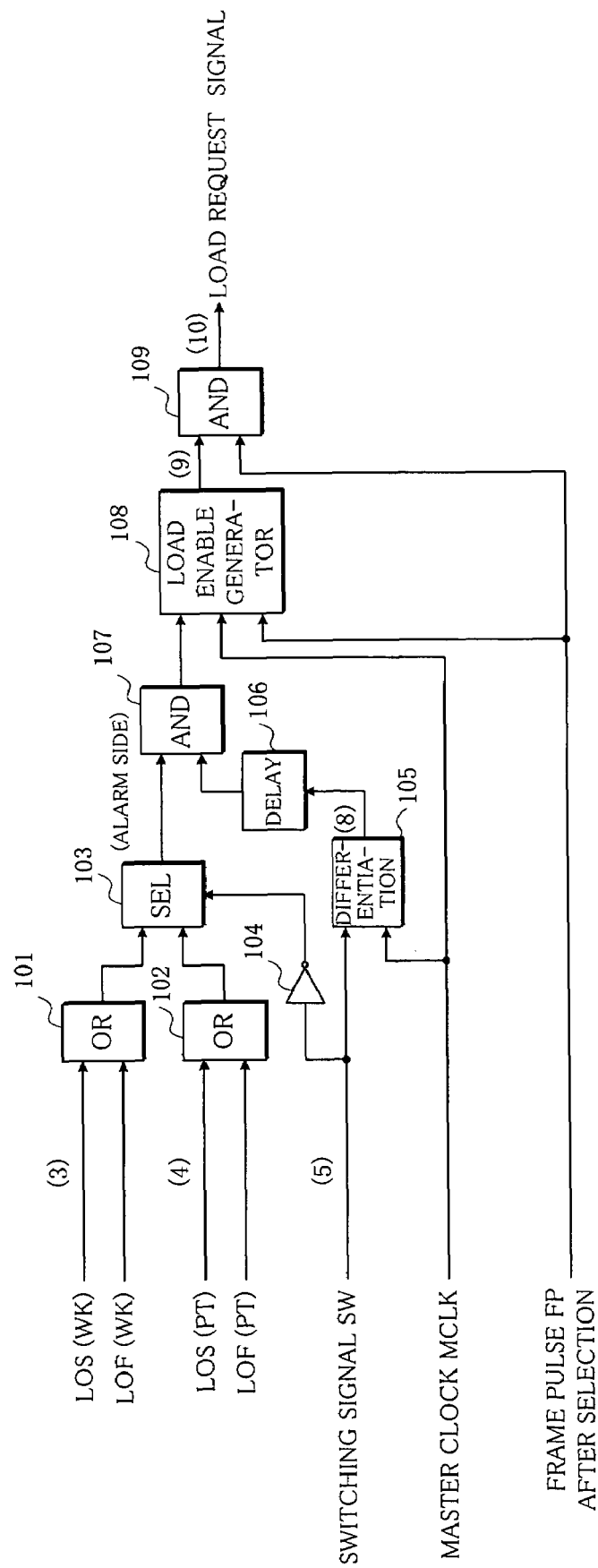
FIG. 2 is a block diagram showing an embodiment of an alarm-time load enable generator used for the present invention shown in FIG. 1.

FIG. 2 shows an embodiment of an alarm-time load enable generator 10 alternatively used for the mask portions 8 and 9. In this embodiment, the same alarm signals LOS (WK) and the LOF (WK) of the working system as those used for the mask portions 8 and 9 are inputted to an OR gate 101, and the LOS (PT) signal and the LOF (PT) signal of the protection system are provided to an OR gate 102. The output signals of the OR gates 101 and 102 are provided to a selector 103, which is connected so as to select a signal that is a manual switching signal SW inverted by an inverter 104, i.e. to select a non-selected system (alarm system).

The output signal of the selector 103 is transmitted to one input terminal of an AND gate 107. The other input terminal is connected through a delay circuit 106 to a differentiation circuit 105 which detects a change of the switching signal SW with reference to a master clock MCLK, and inputs a signal that is a differential signal delayed by a fixed time (a maximum delay time for transferring the frame pulse, and corresponds to the maximum time which an ES memory requires to sweep out a frame pulse) at the delay circuit 106. The output signal of the AND gate 107 is transmitted to a load enable generator 108 with the frame pulse FP after selection through the selector 1, and the output signal of the load enable generator 108 is inputted to an AND gate 109 with the frame pulse FP after selection. The output signal of the AND gate 109 is transmitted to the load signal generator 12 of FIG. 1 as the load request signal. It is to be noted that the load signal generator 12 can be composed by a logical OR gate.

FIGS. 3A-3K show operation time charts of the alarm-time load enable generator 10. Hereinafter, the operation of the embodiment in FIG. 2 will now be described referring to the time charts.

Figure 3:
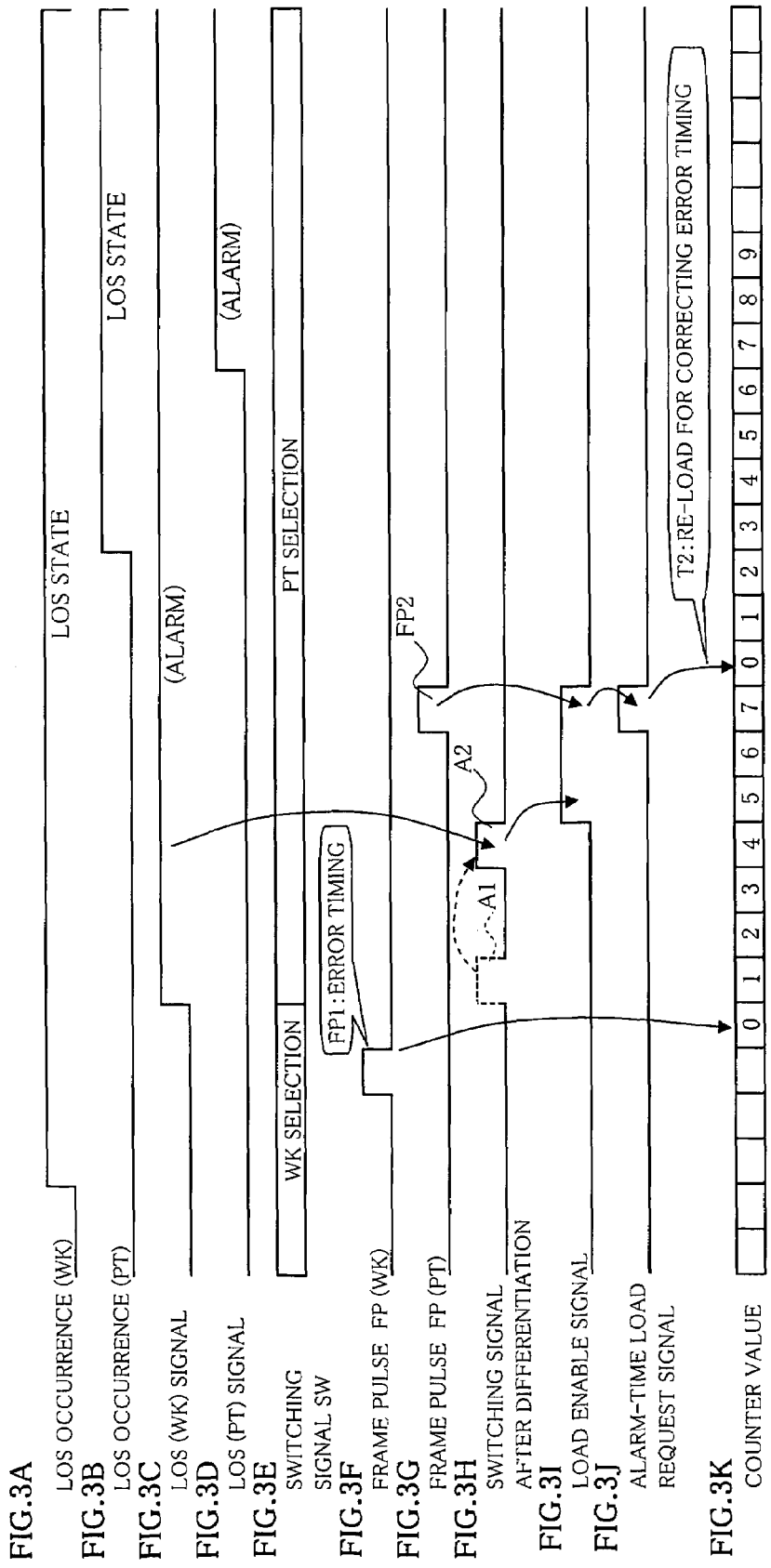
FIGS. 3A-3K are operation time charts of the alarm-time load enable generator shown in FIG. 2.

Firstly, the time charts shown in FIGS. 3A and 3B respectively show states in which an LOS state of the working system and an LOS state of the protection system actually occur (an LOF state is omitted for simplifying the figure). Corresponding to such LOS states of the working system and the protection system, the alarm signals LOS (WK) and LOS (PT) arise with delays as shown in FIGS. 3C and 3D. Supposing the manual switching signal SW makes selection between the working system and the protection system as shown in FIG. 3E, a frame pulse FP1 as shown in FIG. 3F is outputted from the selector 1, with the result that the counter value of the counter 3 may be loaded or reset to "0" as shown in FIG. 3K in some cases.

In order to correct such an error frame timing from the subsequent frame timing, the selector 103 selects the alarm signal LOS (WK) as shown in FIG. 3C to be provided to the AND gate 107. This is because if the switching signal SW is supposed to select the protection system in the example of FIG. 3E, the system of the signal inverted by the inverter 104 indicates the working system. At this time, the switching signal SW after differentiation at the differentiation circuit 105 is transmitted to the delay circuit 106, and then to the AND gate 107 after change information A1 of the switching signal SW is delayed at the delay circuit 106 by the maximum delay time for transferring the frame pulse and becomes change information A2.

Thus, when the alarm signal LOS (WK) still continues an alarm state ("H") even after the change information of the switching signal SW is delayed, the AND gate 107 sets the load enable generator 108 to generate a load enable signal (see FIG. 3I). Hereafter, when a frame pulse FP2 (see FIG. 3G) selected by the selector 1 firstly arrives, the AND gate 2 outputs the load request signal as shown in FIG. 3J and the load enable generator 108 is reset to a load enable state. Accordingly, the load signal generator 12 having received the load request signal provides an alarm-time load request signal to the counter 3, whereby the counter value "0" is loaded as shown in FIG. 3K and the monitoring window is regenerated.

(3) Embodiment of ES Slip-Time Load Enable Generator

Figure 4:
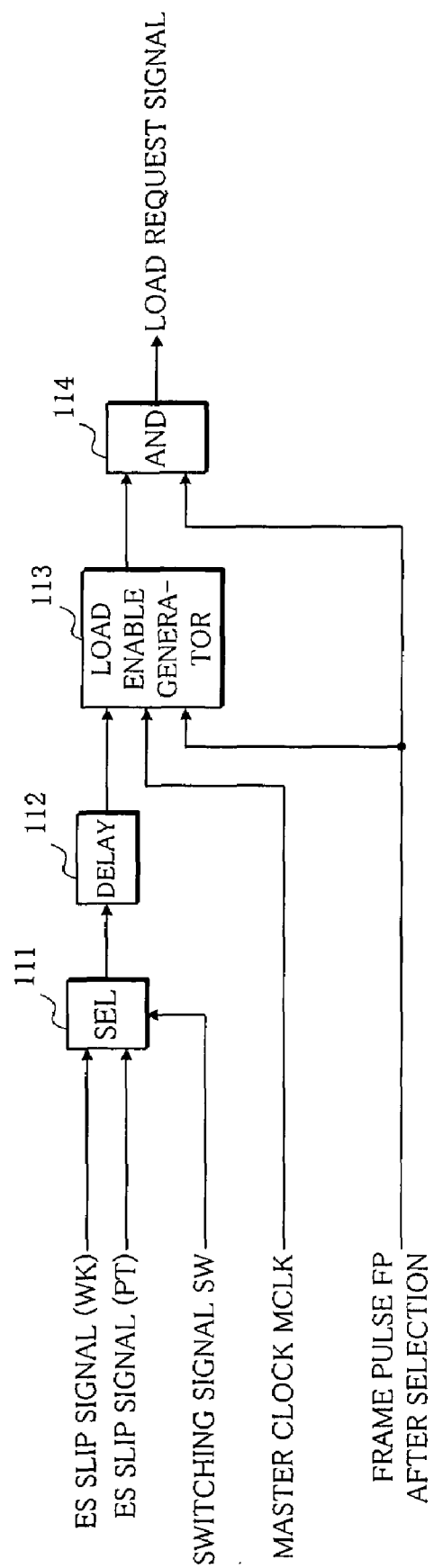
FIG. 4 is a block diagram showing an embodiment of an ES slip-time load enable generator used for the present invention shown in FIG. 1.
Figure 7:
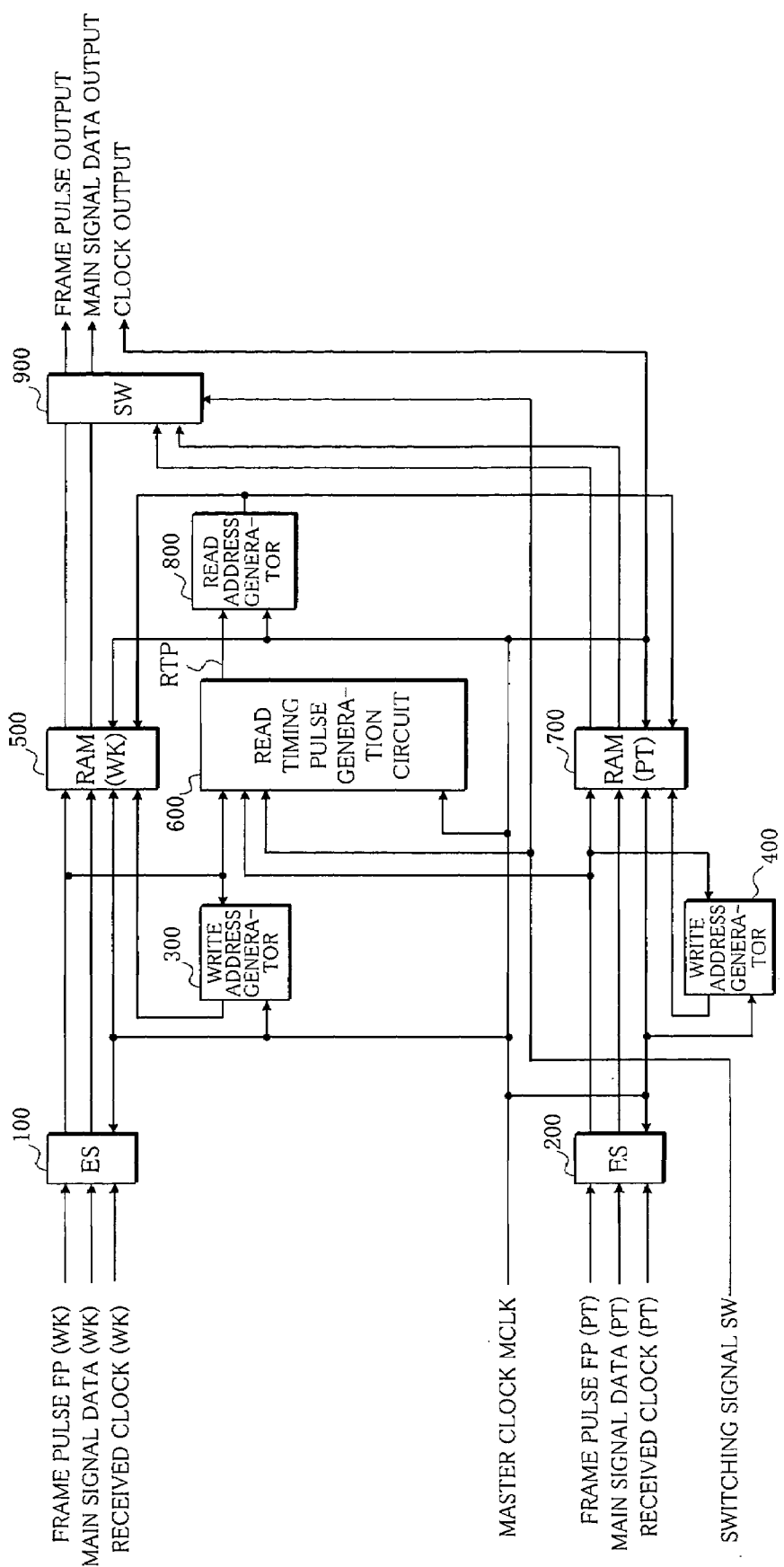
FIG. 7 is a diagram showing an arrangement of a general main signal data switching circuit.

FIG. 4 shows an embodiment of the ES slip-time load enable generator 11 shown in FIG. 1. In this embodiment, e.g. an ES slip signal (WK) of the working system generated by an ES memory 100 as shown in FIG. 7 and an ES slip signal (PT) generated by an ES memory 200 are provided to a selector 111, which transmits a signal selected according to the switching signal SW to a delay circuit 112. This delay circuit 112, in the same way as the delay circuit 106 shown in FIG. 2, provides an output signal of a selector 111 to a load enable generator 113 after delaying the maximum delay time for transferring the frame pulse. The load enable generator 113 and an AND gate 114 correspond to the load enable generator 108 and the AND gate 109 in the alarm-time load enable generator shown in FIG. 2.

Namely, by the switching signal SW, the ES slip signal of the working system or the protection system is selected. The selected signal is provided to the load enable generator 113 after delaying the maximum transferring time of the frame pulse at the delay circuit 112. Thus, the load enable signal of the load enable generator 113 is set, the load request signal is outputted from the AND gate 114 when the first frame pulse FP after selection arrives, and the load enable generator 113 is made a disable state.

Thus, after the occurrence of the ES slip, the load request signal is transmitted to the load signal generator 12 only once by a normal frame pulse, and the counter 3 is loaded to "0".

[2] Embodiment of Master Timing Generation Circuit

The above-mentioned timing pulse generation circuit corresponds to a read timing pulse generation circuit 600 in a general main signal data switching circuit shown in e.g. FIG. 7. The frame pulses FP (WK) and FP (PT) used for the read timing pulse generation circuit 600 are indirectly generated based on the master timing pulse MTP as already shown in FIG. 10.

Figure 5:
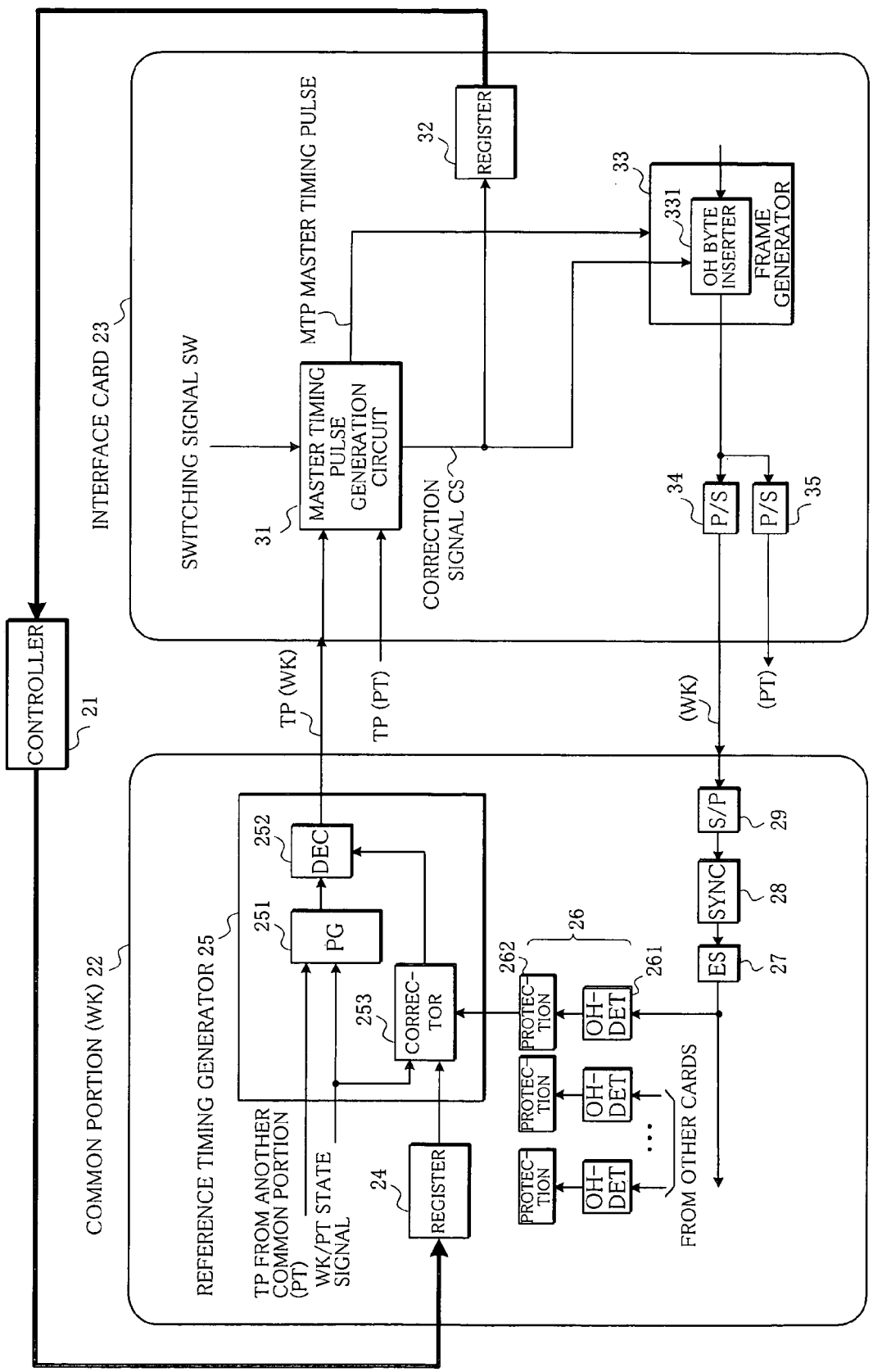
FIG. 5 is a block diagram showing an embodiment of a timing pulse supply system as a timing pulse generation circuit realizing a timing pulse generation method according to the present invention.

Such a master timing pulse generation circuit is mounted on an interface card 23 as shown in FIG. 5. This master timing pulse generation circuit 31 is generated from a reference timing pulse generator 25 mounted on a common portion 22 shown in FIG. 5. The reference timing pulse of the common portion 22 of the working system is provided to the master timing pulse generation circuit 31 with the reference timing pulse TP (PT) from a common portion (not shown) of the protection system, whereby the master timing pulse MTP is generated.

Figure 6:
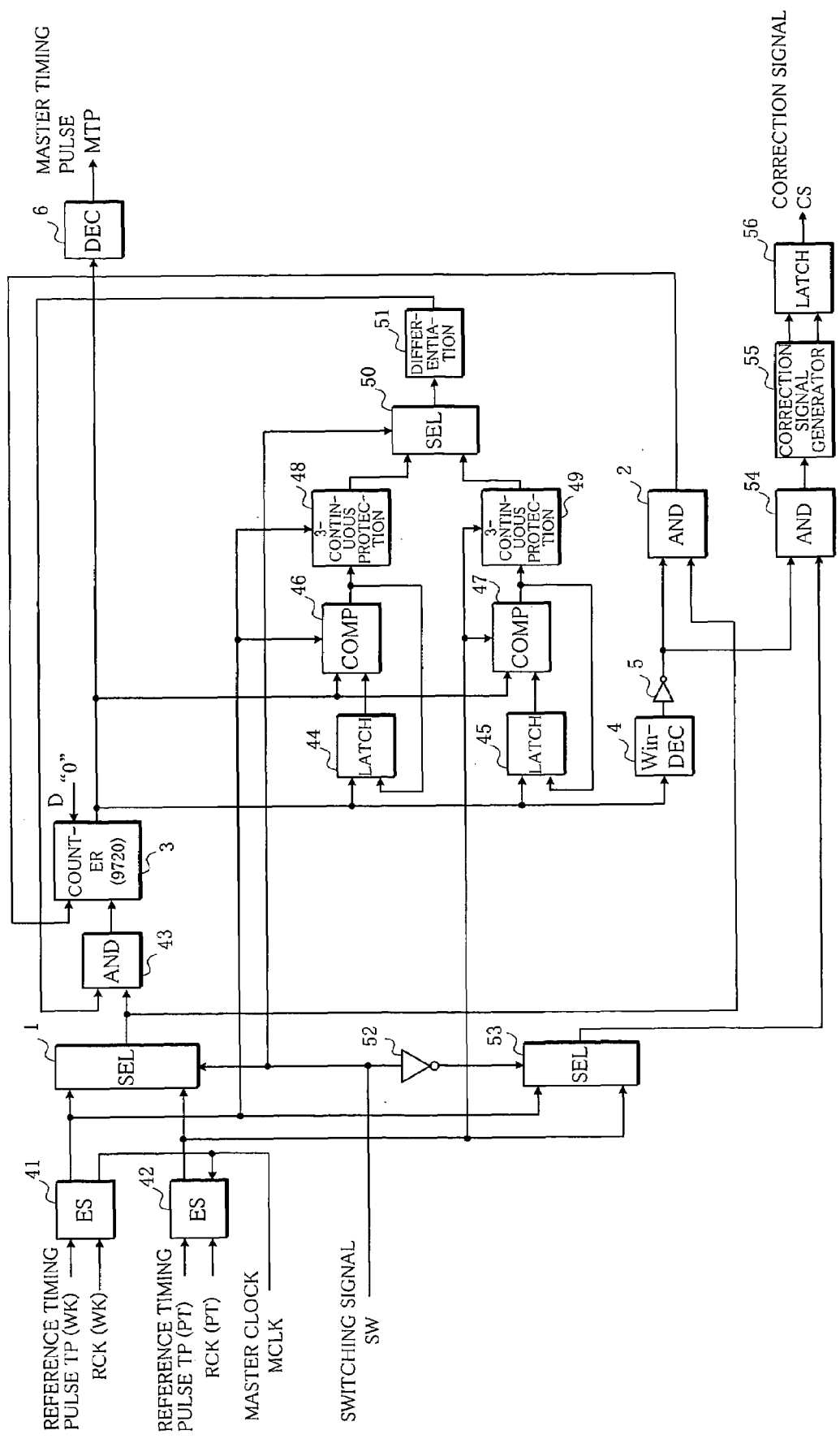
FIG. 6 is a block diagram showing an embodiment of a master timing pulse generation circuit used for the present invention shown in FIG. 5.

FIG. 6 shows an embodiment of the master timing pulse generation circuit 31 mounted on the interface card 23. This embodiment is different from the prior art example of FIG. 10 in that there are provided an inverter 52 and a selector 53 are provided for selecting the reference timing pulse on the side not selected by the switching signal SW, an AND gate 54 for inputting the reference timing pulse selected by the selector 53 and a monitoring window signal outputted through the monitoring window generator 4 and the inverter 5, a correction signal generator 55 for correcting a correction signal based on the output signal of the AND gate 54, and a latch circuit 56 for generating a correction signal CS by latching the output signal of the correction signal generator 55.

Namely, as for the reference timing pulses TP (WK) and TP (PT) of the working system and the protection system to which clock change is performed at the ES memories 41 and 42, the reference timing pulse of the system not selected (alarm system) of the switching signal SW is selected by an existence of the inverter 52 at the selector 53 to be provided to the AND gate 54. Since another input to the AND gate 54 is the monitoring window signal from the monitoring window generator 4 and the inverter 5, both are compared at the AND gate 54. The correction signal indicating the bit number of the reference timing pulse of the non-selected side deviating from the monitoring window and indicating which side (before or after) of the monitoring window the reference timing pulse deviates to is generated at the correction signal generator 55 and outputted as the correction signal CS through the latch circuit 56.

Thus, from the master timing pulse generation circuit 31 according to the present invention, the master timing pulse MTP and the correction signal CS are outputted to be transmitted to the frame generator 33. At the frame generator 33, the correction signal CS is inserted into an overhead of a frame signal at an overhead inserter 331 to be transmitted to the common portions 22 of the working system and the protection system (not shown) respectively as a serial signal through P/S conversion circuits 34 and 35.

Referring to the example of FIG. 5, the frame signal of the working system from the interface card 23 is provided to the common portion (WK) 22 of the working system to be converted into a parallel signal at an S/P conversion circuit 29. A synchronous circuit 28 synchronizes the signal to be transmitted to an extractor 26 after performing clock change at an ES memory 27.

This extractor 26 is composed of an overhead detector 261 and a protector 262. The extractor 26 extracts the correction signal in the overhead in which it sequentially coincides through predetermined stages to be provided to the reference timing generator 25.

The reference timing generator 25 is composed of a pulse generator (PG) 251, a decoder (DEC) 252 for decoding a pulse generated at the pulse generator 251 to a predetermined value to be outputted as the reference timing pulse, and a decoded value corrector 253 for providing a correction value to the decoder 252.

Also, the pulse generator 251 inputs the reference timing pulse TP from the common position of the other system (the common portion of the protection system in this example) and a WK/PT state signal indicating whether the pulse generator 251 itself presently belongs to the working system or the protection system and generates the reference timing pulse. In the decoded value corrector 253, the WK/PT state signal is also provided.

Namely, the correction signal CS extracted from the main signal data by the extractor 26 is held in the corrector 253 only when the common portion of its own belongs to the protection system state by the WK/PT state signal, and updates an original decoded value to a decoded value that is the original decoded value to/from which the correction value by the correction signal CS is added or subtracted to be transferred to the decoder 252 which decodes the decoded value. Thus, the decoder 252 makes decode operation by the updated decoded value, and changes the timing of the reference timing pulse.

The reference timing pulse TP (WK) thus changed is transferred to the master timing pulse generation circuit 31 in the interface card 23. The same entirely applies to the common portion of the protection system.

It is to be noted that the reason why the reference timing generator 25 receives a supply of the reference timing pulse TP from the common portion of the other system is that if the reference timing pulse of the working system at present is corrected, it becomes erroneous. Therefore, the reference timing pulse of the protection system is required to be corrected, and for this reason the reference timing pulse of the protection system is required to be received.

In the above-mentioned embodiment, the frame signal from the interface card 23 is used and the correction signal is inserted into the overhead byte to be transmitted to the common portion. However, it is possible that as shown by thick lines in FIG. 5, a register 32 for once holding the correction signal CS is provided and the correction signal is directly transmitted to a register 24 provided in the common portion 22 through a controller 21 from the register 32.

In this case, the correction signal from the register 24 becomes a logical OR condition with the correction signal from the extractor 26.

I claim:

1. A timing pulse generation method comprising:
   a mask step of masking a frame pulse of a corresponding system when an alarm signal of either a working system or a protection system is received;
   a selection step of selecting the frame pulse after the mask step by a switching signal; and
   a monitoring window generation step of generating a monitoring window which indicates an absorbable range of delay time difference between the frame pulses around the frame pulse selected by the switching signal, of generating a read timing pulse common to memories of both systems at a predetermined timing position, and of regenerating the monitoring window when the selected frame pulse deviates from the monitoring window.

2. A timing pulse generation circuit comprising:
- a mask portion masking a frame pulse of a corresponding system when an alarm signal of either a working system or a protection system is received;
- a selector selecting the frame pulse outputted from the mask portion by a switching signal; and
- a monitoring window generator generating a monitoring window which indicates an absorbable range of delay time difference between the frame pulses around the frame pulse selected by the switching signal, generating a read timing pulse common to memories of both systems at a predetermined timing position, and regenerating the monitoring window when the selected frame pulse deviates from the monitoring window.

* * * * *